United States Patent [19]

Young et al.

[11] Patent Number: 4,760,433

[45] Date of Patent: Jul. 26, 1988

[54] ESD PROTECTION TRANSISTORS

[75] Inventors: W. Ronald Young; Anthony L. Rivoli, both of Palm Bay; John T. Gasner, Melbourne, all of Fla.

[73] Assignee: Harris Corporation, Melbourne, Fla.

[21] Appl. No.: 824,870

[22] Filed: Jan. 31, 1986

[51] Int. Cl.[4] .................. H01L 29/78; H01L 27/02; H01L 31/00; H03K 3/26

[52] U.S. Cl. ..................... 357/23.13; 357/23.8; 357/42; 357/43; 307/310; 307/317 R

[58] Field of Search ............... 357/23.13, 42, 23.8, 357/44, 52, 38, 43; 307/310, 317, 565

[56] References Cited

U.S. PATENT DOCUMENTS

| 3,320,551 | 4/1965 | Miller | 331/113 |
|---|---|---|---|
| 3,403,270 | 9/1968 | Pace et al. | |
| 3,470,390 | 9/1969 | Lin | |
| 3,512,058 | 5/1970 | Khajezadeh et al. | |
| 3,787,717 | 1/1974 | Fischer et al. | |
| 4,096,522 | 6/1978 | Suzuki et al. | 357/45 |
| 4,131,908 | 12/1978 | Daub et al. | |
| 4,283,236 | 8/1981 | Susi | 148/187 |
| 4,288,806 | 9/1981 | Ronen | 357/45 |
| 4,303,958 | 12/1981 | Allgood | |
| 4,356,040 | 10/1982 | Fu et al. | 148/1.5 |
| 4,408,245 | 10/1983 | Pryor | |
| 4,476,476 | 10/1984 | Yu et al. | |
| 4,510,676 | 4/1985 | Anantha et al. | 29/577 |
| 4,521,448 | 6/1985 | Sasaki | 427/88 |

Primary Examiner—Martin H. Edlow
Assistant Examiner—D. Featherstone
Attorney, Agent, or Firm—Barnes & Thornburg

[57] ABSTRACT

A protection circuit including complementary bipolar transistors having collectors connected to an input and base and emitters connected together to a respective voltage source. The bipolar transistors are lateral transistors having a field plate over the base region and spaced laterally from the laterally spaced collector and emitter regions. The base may include increased impurity surface regions extending from the emitter and collector to the gate to increase the beta and decrease the collector-base breakdown.

21 Claims, 4 Drawing Sheets

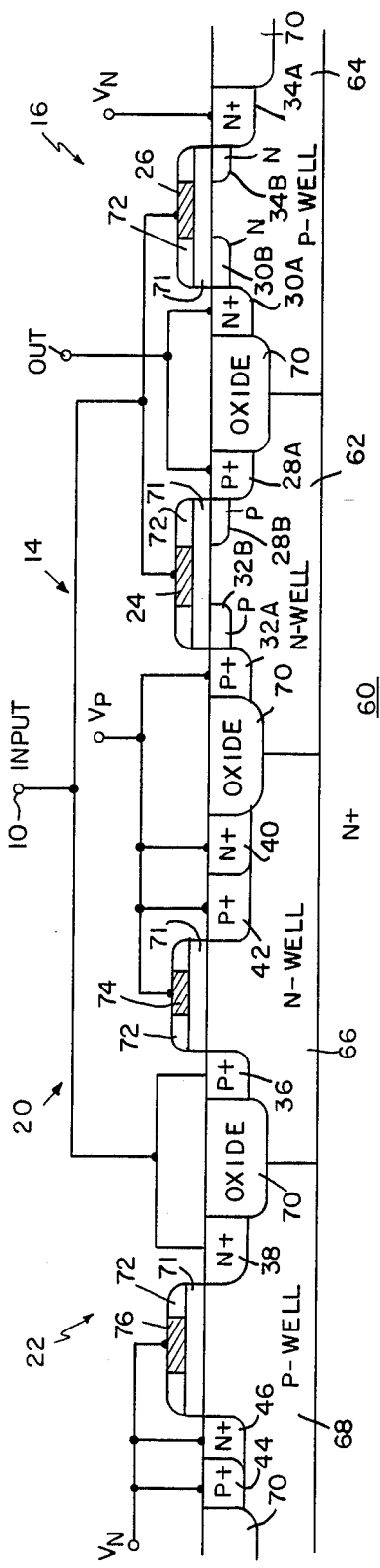
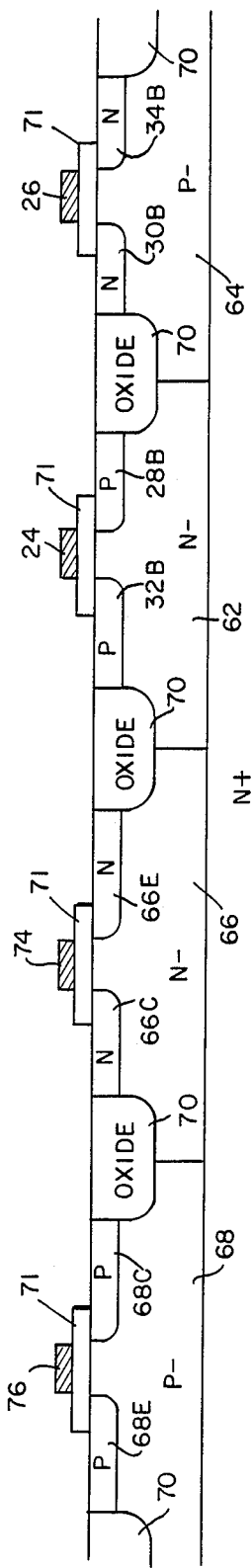
FIG. 3
FIG. 9

ESD PROTECTION TRANSISTORS

BACKGROUND AND SUMMARY OF THE INVENTION

The present invention relates generally to circuit protection and more specifically to an improved electrostatic discharge protection.

Input protection of circuits of the prior art are well known as including one or more devices providing a current path between the input pin and one or both voltage supplies to shunt destructive input signals. The signals were generally caused by electrostatic discharge. These input protection devices are generally used to protect the gates of complementary insulated gate field effect transistors. These devices have included diodes, zener diodes, lateral bipolar transistors, resistive networks, and auxiliary insulated gate field effect transistors.

When the input protection circuit includes lateral bipolar transistors built using a gate over the base region, the voltage for which it can provide protection is limited by the thickness of the gate oxide breakdown voltage. This results because the gates extend to and often beyond the collector region. Therefore, the gate collector breakdown limits its effective protection.

Thus, it is an object of the present invention to provide an improved bipolar lateral transistor structure for use in an input protection circuit.

Another object of the present invention is to provide a lateral bipolar transistor having an equivalent structure to the insulated gate field effect transistors which it is to protect without being limited to the dielectric breakdown of the gate insulator.

These and other objects of the invention are achieved by forming the lateral bipolar transistor having the emitter an collector regions spaced in a base region and a gate over the base region separated laterally from at least the collector region. The gate may also be separated from the emitter region. The base region may include a low impurity base region in which the emitters and collectors are formed as well as a high impurity surface base region extending from the emitter, collector or the emitter and collector regions to the gates. The emitter region may include a deep high impurity region spaced from the gate and a shallow impurity region extending from the deep emitter region to the gate. The gate structure includes a gate and lateral spacers, wherein the lateral spacers extend over the base portion which separates the gate from the emitters and collectors and the shallow emitter portions. The input protection circuit includes a complementary pair of the improved lateral bipolar transistors having their collector regions connected to the input terminal and their base and emitter regions connected together and to appropriate voltage source.

Method of manufacturing the unique lateral bipolar transistor includes forming first and second gates on a portion of an insulative layer on P and N base regions followed by forming insulative spacers extending laterally from the gate regions. N and P impurities are introduced into the P and N-type base regions respectively using the gate and spacers as a mask to form emitter and collector regions laterally spaced in said P and N base regions and laterally spaced from the gates. As a variation to this method, higher impurity surface base regions may be formed between the gate and the emitter or the emitter and collector regions by introducing P and N impurities in the P and N base regions, respectively after the gate has been formed but before the lateral spacers such that the gate acts as a mask to form the high impurity base regions. Similarly, the shallow emitter extensions are formed before formation of the lateral spacers. The P and N base regions may be laterally separated by insulative inserts and the inserts in combination with the gate and the spacers form impurity masks. Impurities may be introduced to form base contact regions adjacent to the emitters and laterally spaced from the area covered by the gate and spacers.

BRIEF DESCRIPTION OF THE DRAWINGS

FIG. 3 is a cross-section of an integrated circuit of the schematic of FIG. 1 incorporating the principles of the present invention.

FIGS. 9 and 10 are cross-sectional views of a wafer illustrating different stages of fabrication incorporating the principles of the present invention.

DETAILED DESCRIPTON OF THE DRAWINGS

Figure 1:
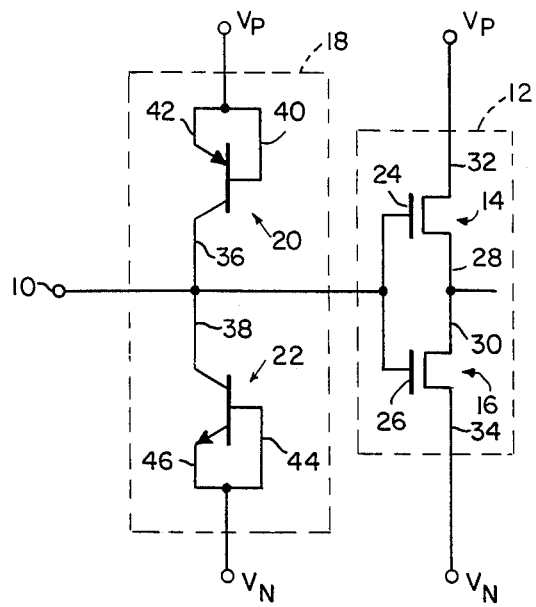
FIG. 1 is a schematic of a protection device incorporating the principles of the present invention.

An integrated circuit, as illustrated in FIG. 1, includes an input 10 connected to an operational circuit 12 which includes for example an inverter having complementary insulated gate field effect transistors 14 and 16 connected between positive voltage source $V_P$ and negative voltage source $V_N$. A protection circuit 18 is also connected to the input 10 and includes bipolar transistors 20 and 22 connected respectively to voltage sources $V_P$ and $V_N$. P channel device 14 and N channel device 16 includes gates 24 and 26 oonneoted together to input 10, drains 28 and 30 connected together as an output and sources 32 and 34 connected to the voltage sources $V_P$ and $V_N$ respectively. The input protective circuit includes a PNP transistor 20 and NPN transistor 22 having their collectors 36 and 38 connected to input 0, their bases 40, 42 and 44, 46 connected to voltage sources $V_P$ and $V_N$ respectively.

For normal operating voltages, the protective circuit 18 is inoperative with transistors 20 and 22 being off. If the input should become positive with respect to $V_P$, transistor 20 turns on by forward biasing the collector-base junction and provides a path between the input 10 and the voltage source $V_P$. If the input voltage should continue to rise and become extremely positive with respect to $V_N$, the collector-base junction of transistor 22 goes into reverse breakdown and subsequently into secondary breakdown. Thus, an additional current capacity path is provided.

When the input 10 becomes negative with respect to $V_N$, the collector-base junction of transistor 22 is forward biased and provides a current path to $V_N$. With the input 10 becoming extremely negative, the collector-base junction of transistor 20 is reverse biased and breaks down providing a path to $V_P$ and further breaks down going through secondary breakdown at even higher current levels. Thus, the complementary pair of bipolar transistors operate individually to protect against small excursions of input signals outside the voltage range of $V_P$ to $V_N$ and operate in combination to protect against large excursions of input signals outside the range.

Figure 2:
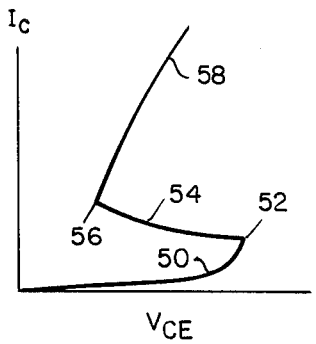
FIG. 2 is a graph of the voltage/current of the protection device in FIG. 1.

The reverse breakdown characteristics of the transistors is illustrated in FIG. 2. The leakage current through the reverse biased transistor is illustrated by segment 50 until it reaches 52 wherein the primary reverse breakdown occurs. The operating characteristics then follow segment 54 to the second breakdown 56. The operation after secondary breakdown 56 is illustrated by segment 58. The collector current through collectors 36 and 38 in the forward biased mode is equal to the base current times one plus beta. Thus, the transistor action provides increase current capacity over standard diodes.

In order to minimize the surface area needed for the high capacity bipolar transistors 20 and 22, efforts must be made to maximize the beta by using short base widths.

FIG. 3 illustrates an integrated circuit having improved lateral bipolar transistors for use in the protective circuit. The substrate 60 is an N+ having N— well 62, P— wel 64, N—well 66 and P—well 68 formed therein and separated at their surface by lateral insulative inserts 70. The P channel device 14 is formed in N—well 62 which forms the body and channel region. The source 28 includes a deep P+ region 28A and a shallow P region 28B. Drain 32 includes a deep P+ region 32A and a shallow P region 32B. The gate 24 is separated from the well 62 by an insulative layer 71 and includes lateral insulative spacers 72. The N channel insulative field effect transistor 16 is built in P—well 64. Drain region 30 includes a deep N+ region 30A and a shallow surface N region 30B. The source includes a deep N+ region 34A and shallow N region 34B. The gate 26 also includes insulative layer 71 and spacer 72. As will be discussed more fully below, the deep source and drain regions are aligned with the outside of the spacer 72 while the shallow source and drain regions are aligned with the edge of the gates 24 and 26.

The bipolar transistor 20 and 22 are formed in N— and P— well regions 66 and 68 respectively which function as the base of the respective transistors. Formed in N— base well 66 are laterally spaced P+ collector region 36 and emitter region 42. An N+base contact region 40 is formed in the N— base well 66 adjacent the emitter region 42 and outside the base region between the emitter 42 and collector 36. A gate 74 is separated from the base region 66 by insulator 71 and includes lateral insulator spacers 72. The gate 74 is connected to the emitter region 42, the base contact region 40 and voltage source $V_P$. The NPN transistor 22 includes N+ collector and emitter regions 38 and 46 formed in the P— base region 68 and a P+ base contact region 44. A gate 76 is also separated from the base region 68 by an insulative layer 71 and includes lateral insulative spacer 72. The gate 76 is connected to the emitter region 46, the base contact region 44 and voltage source $V_N$.

As will be noted, the emitter and collector regions of lateral bipolar transistors 20 and 22 are aligned with the outer edge of spacer 72. The gates 74 and 76 on the lateral bipolar transistor act as field plates which decrease the breakdown voltage of the collector-base junction for a given impurity concentration of the wells 66 and 68. Because the gates act as field plates, the spacing of the gates 74 and 76 from the collector regions is preferable. Otherwise, the collector-to-field plate breakdown would be limited by the dielectric breakdown of the thin oxide layer 71. This spacing allows the breakdown and operation of the lateral bipolar transistors 20 and 22 to be a function of the bipolar action and not the dielectric breakdown.

Figure 4:
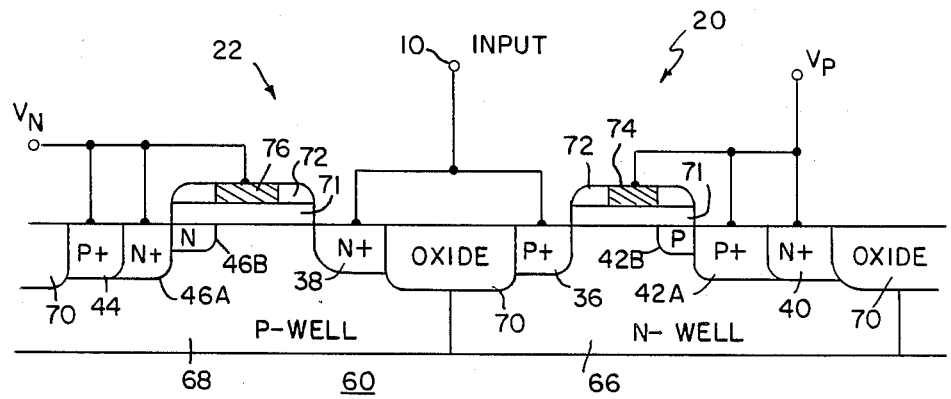
FIG. 4 is a cross-sectional view of another embodiment of an improved lateral bipolar transistor incorporating the principles of the present invention.

To further reduce the base width and, thus, increase beta, shallow emitter regions are formed. As illustrated in FIG. 4, a P surface emitter region 42B is formed in the N— base region 66 extending from the deep P+ emitter region 42A and a shallow N emitter region 46B is formed in the P— base region 68 extending from the deep N+ emitter region 46A. Not only does this increase the beta, but it does not decrease the gate-to-collector breakdown voltage since it is defined by the surface impurity concentration of the base region 66 and 68 adjacent the collector respectively.

Figure 5:
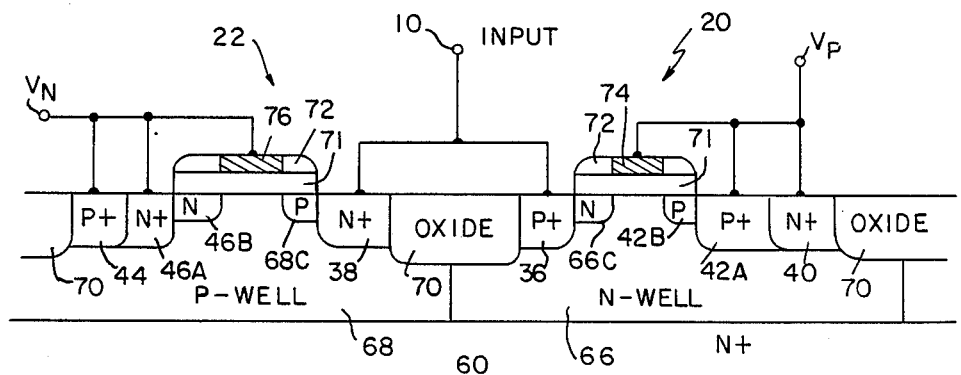
FIG. 5 is a cross-sectional view of an even further embodiment of an improved lateral bipolar transistor incorporating the principles of the present invention.

As an alternative, as illustrated in FIG. 5, the collector region may also include an N surface base region 66C for transistor 20 or a P surface base region 68C for transistor 22. The use of the increased impurity base surface regions adjacent to the collector reduces the collector-base breakdown voltage and raises punch-through voltage. Since the increased surface region 66C and 68C is of the same conductivity type as the base region 66 and 68 respectively, they remain at a lower potential than the high impurity collector regions 36 and 38 respectively. Therefore it will not reduce the gate-to-collector breakdown voltage below that of the base-collector junction. The extended emitter provides increased beta as in FIG. 4.

Figure 6:
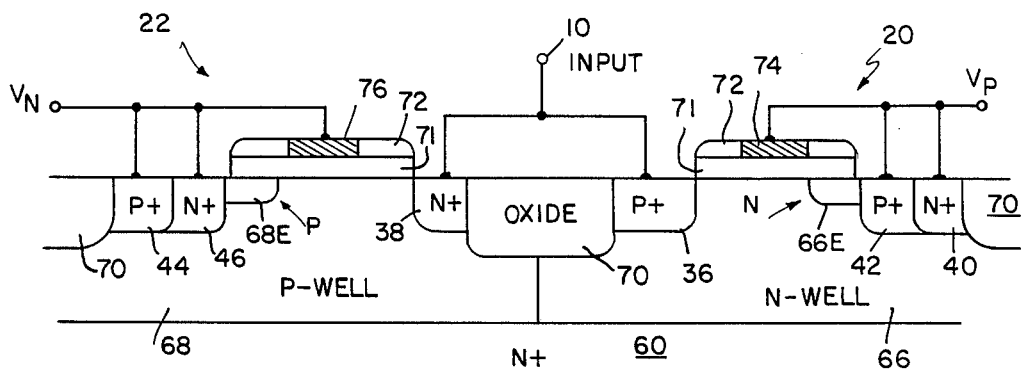
FIG. 6 is a cross-sectional view of still another embodiment of an improved lateral bipolar transistor incorporating the principles of the present invention.
Figure 7:
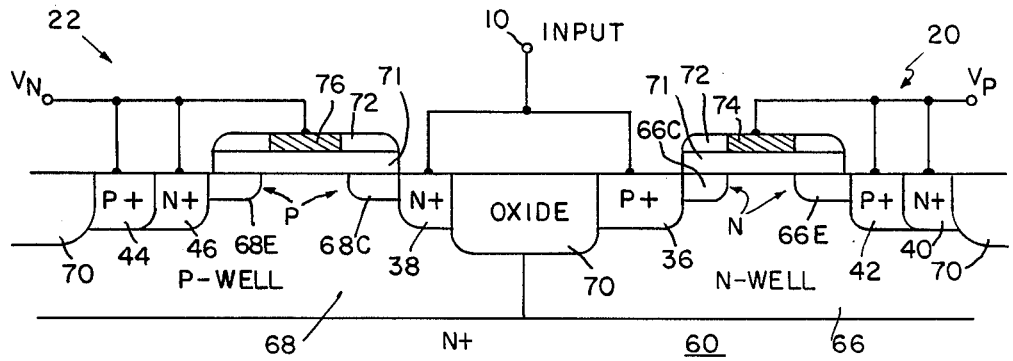
FIG. 7 is a cross-sectional view of an even further embodiment of an improved lateral bipolar transistor incorporating the principles of the present invention.
Figure 8:
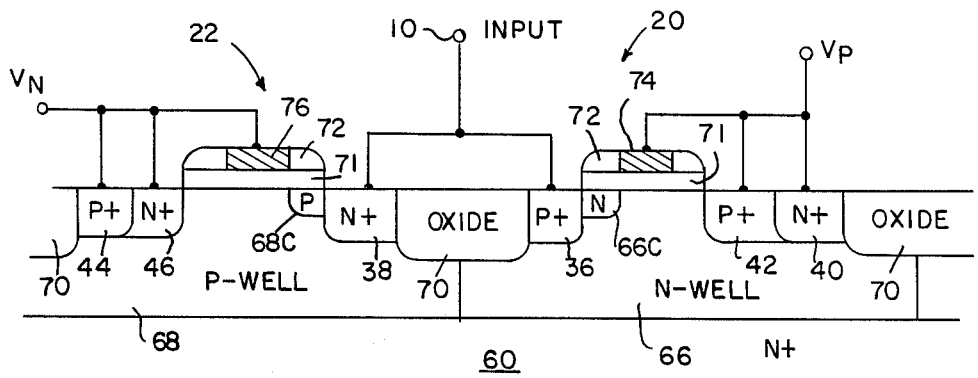
FIG. 8 is a cross-sectional view of a still even further embodiment of an improved lateral bipolar transistor incorporating the principles of the present invention.

To reduce the series-on resistance, an increased base surface concentration region may be formed. As illustrated in FIG. 6, an N surface base region 66E is formed in N— base 66 on the emitter 42 side for transistor 20 and a P base region 68 is formed in P— base 68 on the emitter 46 side for transistor 22. The base-to-collector breakdown is defined by the surface impurity concentration of the base region 66 and 68 respectively. As in FIG. 5, the transistors of FIG. 6 may also include a collector region having an N surface base region 66C for transistor 20 and a P surface base region 68C for transistor 22. This is illustrated in FIG. 7 and yields reduced collector-base breakdown and a rise in punch-through voltage without the benefit of an increased beta. FIG. 8 shows the increased impurity surface base region adjacent the collector only as a modification to FIG. 7.

The method of fabricating the integrated circuits of FIGS. 3 through 8 is a modification of the process described in U.S. Ser. No. 620,835 filed June 15, 1984 to Gasner, which is incorporated herein by reference. The process is briefly outlined in the illustrations of FIGS. 9 and 10 to describe the fabrication of the FIG. 7 device. A wafer is processed to form the wells 62, 64, 66, and 68 on the substrate 60 separated laterally by insulative insert 70. The gate insulative layer 71 is formed on the surface of the wells and a gate material is applied thereon and delineated to form gates 24, 26, 74 and 76. It should be noted that although the gate insulative layer 71 is illustrated as discrete layers, they are only portions of a continuous layer over the surface region of the wells 62, 64, 66 and 68. Using the delineated gates 24, 26, 74 and 76 as mask, in combination with other necessary masks as described in the above-mentioned application, N−impurities and P−impurities are introduced to form shallow source and drain regions and higher impurity surface base regions as illustrated in FIG. 9. These regions are defined by the edge of masks, gates 24, 26, 74 and 76 and the oxide inserts 70. This is the process forming the lateral bipolar transistor of FIG. 7. If the FIG. 6 embodiment is to be formed, masks are provided such that 68C and 66C are not formed during these processing steps. If the embodiment of FIG. 3 is to be formed, masking steps are provided such that 66C and 66E and 68C and 68E are not formed.

Figure 10:
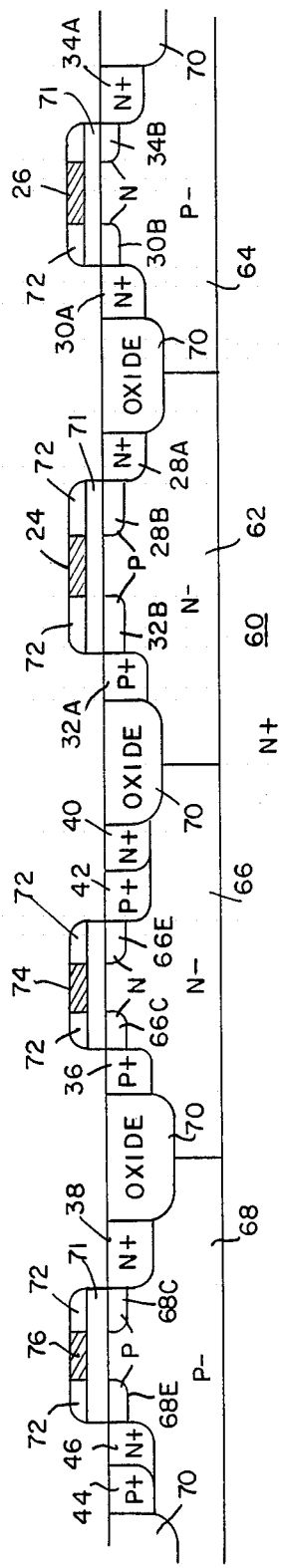

Next, oxide spacers 72 are formed extending laterally from gates 26, 24, 74 and 76. These gates and their spacers are then used with other appropriate masks to introduce P and N−type impurities to form the deep source and drain regions 30A, 34A, 32A, 28A deep collector regions 36, 38, base contact regions 40, 44 and deep emitter regions 42, 46 as illustrated in FIG. 10. The deep source, drain collector, base contacts and emitter regions are defined by masks, the outside edge of the spacers 72 and the oxide insert 70. This process, of the previously described application to form complementary insulated gate field effect transistors, is also used to form unique lateral bipolar transistors having field plates.

From the preceding description of the preferred embodiments, it is evident that the objects of the invention are attained, and although the invention has been described and illustrated in detail, it is to be clearly understood that the same is by way of illustration and example only. The present process is not to be limited by the method of fabricating the wells or insulative layer inserts. The substrate may be a P, N, P+ and N+ or any substrate into which N and P device wells are formed for example an epitaxial layer on an N or P substrate, SOI, DI or SOS. The spirit and scope of the invention are to be limited only by the terms of the appended claims.

What is claimed is:

1. In a protection circuit connected to an input terminal for receiving an input signal and a circuit for protecting said circuit from input signals outside desired limits, the improvement comprising:
a lateral PNP bipolar transistor including P-type emitter and collector regions, laterally spaced in an N-type base region and a first gate over a portion of said N base region between said emitter and collector regions and separated vertically from said base portion by a layer of insulation and laterally from said collector region, said gate, base region and emitter region being connected to a first voltage source and said collector region connected to said input terminal and said protected circuit; and
a lateral NPN bipolar transistor including N-type emitter and collector regions spaced laterally in a P-type base region and a second gate over a portion of said P-base region between said emitter and collector regions and separated vertically from said base portion by a layer of insulation and laterally from said collector region, said second gate, base region and emitter region being connected to a second voltage source and said collector region being connected to said input terminal and said protected circuit.

2. A protection circuit according to claim 1, wherein:
said base region of said PNP includes a low impurity N-type base region in which said emitter and collector regions are formed and a higher impurity N-type base surface region extending between said collector region and said first gate; and
said base regions of said NPN includes a low impurity P-type base region in which said emitter and collector regions are formed and a higher impurity P-type base surface region extending between said collector region and said second gate.

3. A protection circuit according to claim 2, wherein said first and second gates are also laterally spaced from a respective emitter region.

4. A protection circuit according to claim 3, wherein:
said base region of said PNP includes a low impurity N-type base region in which said emitter and collector regions are formed and a higher impurity N-type base surface region extending between said emitter region and said first gate; and
said base regions of said NPN includes a low impurity P-type base region in which said emitter and collector regions are formed and a higher impurity P-type base surface region sxtending between said emitter region and said second gate.

5. A protection circuit according to claim 3, wherein: said base-region of said lateral transistors includes a low impurity base regions in which said emitter and collector regions are formed and a higher impurity base region extending from said emitter and collector regions to said first and second gates respectively.

6. A protection circuit according to claim 1, wherein:
said base region of said PNP includes a low impurity N-type base region in which deep emitter and collector regions are formed and spaced laterally from said first gate and a P-type shallow emitter region extending between said deep emitter region and said first gate; and
said base regions of said NPN includes a low impurity P-type base region in which deep emitter and collector regions are formed and spaced laterally from said first gate and and N-type shallow region extending between said deep emitter region and said second gate.

7. A protection circuit according to claim 6, wherein:
said base region of said PNP includes a higher impurity N-type base surface region extending between said deep collector region and said first gate; and
said base region of said NPN includes a higher impurity P-type base surface region extending between said deep collector region and said second gate.

8. A protection circuit according to claim 1, wherein when said input signal exceeds said first voltage source by a first positive valve, the base collector junction of the PNP bipolar transistor is forward biased and conducts and when the said input signal exceeds said first voltage source by a second value more positive than said first value, a base collector junction of said NPN bipolar transistor is in reverse breakdown and subsequently into secondary breakdown; and when said input signal becomes negative with respect to said second voltage source by a third value, said base collection junction of said NPN transistor becomes forward biased and when it becomes more negative with respect to said second voltage source by a fourth value greater than said third value, said collector base junction of said PNP transistor goes into reverse breakdown and subsequent secondary breakdown.

9. In a protection circuit connected to an input terminal for receiving an input signal and an insulated gate field effect transistor circuit to be protected, the improvement comprising a pair of complementary lateral bipolar transistors connected between said input terminal and a respective supply terminal, each bipolar transistor including emitter and collector regions laterally spaced in a base region and a gate over said base region between said emitter and collector regions and separated therefrom by an insulative layer, said gates are laterally spaced from a respective collector region, said gates, base regions and emitter regions of each transistor are connected together to a respective supply terminal and said collector regions are connected to said input terminal.

10. A protection circuit according to claim 9, wherein said base regions of said bipolar transistors each include a low impurity base region in which said emitter and collector regions are formed and a high impurity base surface region extending between said collector region and said gate.

11. A protection circuit according to claim 10, wherein each gate includes a gate with lateral insulative spacers extending laterally from said gate to said collector regions and said high impurity base surface region extends below said lateral insulative spacer.

12. A protection circuit according to claim 9, wherein said gates are also laterally spaced from a respective emitter region.

13. A protection circuit according to claim 12, wherain said base regions of said bipolar transistors each include a low impurity base region in which said emitter and collector regions are formed and a high impurity base surface region extending between said emitter region and said gate.

14. A protection circuit according to claim 12, wherain said base regions of said bipolar transistors each include a low impurity base region in which said emitter and collector regions are formed and a high impurity base surface region extending from said emitter and collector regions to said gate.

15. A protection circuit according to claim 14, wherein each gate includes a gate with lateral insulative spacers extending laterally from said gate to said emitter and collector regions and said high impurity base surface region extend below said lateral insulative spacers.

16. A protection circuit according to claim 12, wherein each gate includes a gate with lateral insulative spacers extending laterally from said gate to said emitter and collector regions.

17. A protection circuit according to claim 9, wherein said base regions of said bipolar transistors each include a low impurity base region in which said deep emitter and collector regions are formed laterally spaced from said gates and a high impurity shallow emitter region extending between said emitter region and said gate.

18. A protection circuit according to claim 17, wherein each gate includes a gate with lateral insulative spacers extending laterally from said gate to said emitter and collector ragions and said shallow emitter regions extend below said lateral insulative spacer.

19. A protection circuit according to claim 17, wherein said base regions include a high impurity base surface region extending between said deep collector regions and said gates.

20. A protection circuit according to claim 19, wherein each gate includes a gate with lateral insulative spacers extending laterally from said gate to said deep emitter and collector regions and said high impurity base surface regions and said shallow emitter regions extend below said lateral insulative spacer.

21. A protection circuit according to claim 9, wherein when said input signal is positive with respect to a positive supply terminal, both transistors are conducting with one transistor being in a forward biased breakdown and the other transistor being in a reverse secondary breakdown and when the input signal is negative with respect to a negative supply terminal, said other bipolar transistor both of them are on with said other transistor being in a forward breakdown and said one transistor being in reverse secondary breakdown.

* * * * *